(12) United States Patent
Oyu

(10) Patent No.: US 7,682,895 B2
(45) Date of Patent: Mar. 23, 2010

(54) SEMICONDUCTOR DEVICE AND METHOD OF MANUFACTURING THE SAME

(75) Inventor: Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 86 days.

(21) Appl. No.: 11/678,894

(22) Filed: Feb. 26, 2007

(65) Prior Publication Data

US 2007/0207577 A1 Sep. 6, 2007

(30) Foreign Application Priority Data

Mar. 6, 2006 (JP) ............................. 2006-059906

(51) Int. Cl.
*H01L 21/8238* (2006.01)
(52) U.S. Cl. ................ 438/227; 438/460; 257/E21.544
(58) Field of Classification Search ................ 438/227, 438/460; 257/E21.544
See application file for complete search history.

(56) References Cited

U.S. PATENT DOCUMENTS 4,420,722 A * 12/1983 Todd ........................... 324/767
4,716,451 A * 12/1987 Hsu et al. ..................... 257/371
6,593,799 B2 * 7/2003 De et al. ...................... 327/534
2003/0057522 A1 * 3/2003 Francis et al. ............... 257/566
2006/0211170 A1 * 9/2006 Oyu et al. .................... 438/106

FOREIGN PATENT DOCUMENTS

JP 2005-277116 A 10/2005

* cited by examiner

*Primary Examiner*—George Fourson
*Assistant Examiner*—John M Parker
(74) *Attorney, Agent, or Firm*—Sughrue Mion, PLLC

(57) ABSTRACT

A method of manufacturing a semiconductor device includes: (A) a wafer process; and (B) a bias application process after the wafer process. The wafer process includes: (a) forming a n-type well in a p-type semiconductor substrate; (b) forming a p-type well in the n-type well; and (c) forming a transistor on the p-type well, the transistor having a n-type source/drain diffusion layer. In the bias application process, a forward bias is applied between the p-type well and the n-type well to move heavy metal ions.

19 Claims, 9 Drawing Sheets

Fig. 11

| PROCESS | | EXAMPLE-1 | EXAMPLE-2 | EXAMPLE-3 | COMPARATIVE EXAMPLE |
|---|---|---|---|---|---|
| BEFORE 1st INSPECTION (STEP S21) | | ○ | ○ | ○ | × |
| STEP S71 | | ○ | ○ | ○ | × |
| BEFORE 2nd INSPECTION (STEP S91) | | × | ○ | ○ | × |
| HEAVY METAL GETTERING SITE | | × | × | ○ | × |
| FRACTION DEFECTIVE | 1st INSPECTION | 0.2% | 0.2% | 0.1% | 1% |
| | 2nd INSPECTION | 1% | 0.5% | 0.1% | 5% |

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. In particular, the present invention relates to a technique for dealing with heavy metal pollution of a semiconductor device.

2. Description of the Related Art

In a typical semiconductor device, a deep n-type well (may be hereinafter referred to as a n-type well) is formed in a p-type semiconductor substrate, and a shallow p-type well (may be hereinafter referred to as a p-type well) is formed in the deep n-type well. Moreover, a MOS transistor is formed on the shallow p-type well. The MOS transistor has a n-type source/drain diffusion layer, a gate oxide film and a gate electrode.

Such a semiconductor device is manufactured through several processes. During the manufacturing processes, there is a possibility that the semiconductor device is polluted with heavy metal. If heavy metal ions move into a depletion layer around a p-n junction between the n-type source/drain diffusion layer and the shallow p-type well due to the heavy metal pollution, a p-n junction leakage current through the p-n junction increases. The increase in the p-n junction leakage current causes circuit malfunction such as deterioration of data retention characteristic of a DRAM, increase in a standby current in an SRAM and the like, which decreases the reliability of the semiconductor device. It is therefore desirable to provide a technique that can eliminate heavy metals from around the p-n junction.

Moreover, a characteristic inspection is usually carried out for plural times during the above-mentioned processes of manufacturing the semiconductor device. For example, a characteristic inspection is performed in a wafer state, and another characteristic is further performed after a packaging process. If the heavy metal pollution occurs prior to a characteristic inspection process in the wafer state, the yield at the characteristic inspection process in the wafer state is decreased. Moreover, if the heavy metal pollution occurs during a wafer back-side grinding process or the packaging process, a non-defective product may become a defective product which is found at the characteristic inspection after the packaging process is completed. That is to say, the number of defective products increases and the yield decreases at every characteristic inspection process.

It is therefore desirable to improve the yield at each characteristic inspection process and thereby to improve the yield as a whole.

Japanese Laid-Open Patent Application JP-P2005-277116 discloses a semiconductor device provided with a gettering layer. The gettering layer is formed by implanting impurities into a chip back-side after a semiconductor chip is produced.

SUMMARY OF THE INVENTION

An object of the present invention is to provide a semiconductor device and a method of manufacturing the same in which heavy metals are eliminated from around a p-n junction.

Another object of the present invention is to provide a semiconductor device and a method of manufacturing the same in which a p-n junction leakage current is suppressed and the yield is improved.

In a first aspect of the present invention, a method of manufacturing a semiconductor device is provided. The manufacturing method according to the present invention includes: (A) a wafer process (circuit formation process). The wafer process includes: (a) forming a n-type well in a p-type semiconductor substrate; (b) forming a p-type well in the n-type well; and (c) forming a transistor on the p-type well. The transistor has a n-type source/drain diffusion layer. The manufacturing method according to the present invention further includes: (B) after the (A) process, applying a forward bias between the p-type well and the n-type well to move heavy metal ions.

During the above-mentioned (B) process, a heavy metal ion existing in a depletion layer around an interface between the n-type source/drain diffusion layer and the p-type well moves toward the side of the p-type well due to the built-in potential difference between the n-type source/drain diffusion layer and the p-type well (see FIG. 5). The heavy metal ion attracted to the p-type well further moves into the n-type well due to the forward bias applied between the p-type well and the n-type well. Furthermore, the heavy metal ion attracted to the n-type well moves into the p-type semiconductor substrate due to the built-in potential difference between the n-type well and the p-type semiconductor substrate. In this manner, the heavy metal ion is eliminated from the depletion layer around the interface between the n-type source/drain diffusion layer and the p-type well toward the p-type semiconductor substrate. As a result, the p-n junction leakage current is suppressed and the yield is improved.

In the above-mentioned (B) process, a reverse bias may be further applied between the p-type well and the n-type source/drain diffusion layer. When the reverse bias is applied between the p-type well and the n-type source/drain diffusion layer, the potential difference between the n-type source/drain diffusion layer and the p-type well is enlarged (see FIG. 6). As a result, the heavy metal ion in the depletion layer around the interface between the n-type source/drain diffusion layer and the p-type well moves faster to the p-type well.

In the above-mentioned (B) process, a reverse bias may be further applied between the p-type semiconductor substrate and the n-type well. When the reverse bias is applied between the p-type semiconductor substrate and the n-type well, the potential difference between the n-type well and the p-type semiconductor substrate is enlarged (see FIG. 6). As a result, the heavy metal attracted to the n-type well moves faster to the p-type semiconductor substrate.

The manufacturing method according to the present invention can further include: (C) after the (A) process, inspecting circuit characteristics of a wafer; (D) after the (C) process, dicing the wafer to produce a semiconductor chip and packaging the semiconductor chip; and (E) after the (D) process, inspecting circuit characteristics of the semiconductor chip. The above-mentioned (B) process is performed at least one of timings between the (A) process and the (C) process, in the (D) process and between the (D) process and the (E) process.

In the present invention, the above-mentioned (A) process can further include: (d) forming a heavy metal gettering site in at least one of the p-type semiconductor substrate and the p-type well (see FIG. 8). The heavy metal gettering site traps the heavy metal ion. For example, the heavy metal gettering site is formed at a position in the p-type semiconductor substrate adjacent to a depletion layer (see FIG. 9). The heavy metal gettering site may be further formed at a position in the p-type well adjacent to a depletion layer (see FIG. 9). For example, when the heavy metal gettering site is formed in the p-type well adjacent to the depletion layer, the heavy metal gettering site is located near the junction between the n-type source/drain diffusion layer and the p-type well. Since the heavy metal gettering site traps the heavy metal ion, it is possible to eliminate the heavy metal ion more quickly.

In a second aspect of the present invention, a semiconductor device is provided. The semiconductor device according to the present invention is provided with: a p-type semiconductor substrate; a n-type well (deep n-type well) formed in the p-type semiconductor substrate; a p-type well (shallow p-type well) formed in the n-type well; a transistor formed on the p-type well; and a heavy metal gettering site. The transistor has a n-type source/drain diffusion layer formed in the p-type well, a gate insulating film and a gate electrode. The heavy metal gettering site is formed in at least one of the p-type semiconductor substrate and the p-type well. For example, the heavy metal gettering site is formed at a position in the p-type semiconductor substrate adjacent to a depletion layer. The heavy metal gettering site may be further formed at a position in the shallow p-type well adjacent to a depletion layer.

In the semiconductor device according to the present invention, the heavy metal gettering site may include an oxygen precipitate region where oxygen is precipitated. Alternatively, the heavy metal gettering site may include a lattice distorted section where crystal lattice is distorted. The lattice distorted section may have higher boron (B) concentration than the surrounding section, or the lattice distorted section may include titanium silicide, or the lattice distorted section may be formed by introducing carbon (C).

According to the present invention, it is possible to provide a semiconductor device in which heavy metals are eliminated from around the p-n junction.

According to the present invention, it is possible to provide a semiconductor device in which the p-n junction leakage current is suppressed and to improve the yield.

BRIEF DESCRIPTION OF THE DRAWINGS

The above and other objects, advantages and features of the present invention will be more apparent from the following description taken in conjunction with the accompanying drawings, in which:

FIG. 11 is a table showing conditions for several examples and corresponding fraction defective.

DESCRIPTION OF THE PREFERRED EMBODIMENTS

A semiconductor device and a method of manufacturing the same according to the present invention will be described below with reference to the attached drawings.

1. First Embodiment 1-1. Structure

Figure 1:
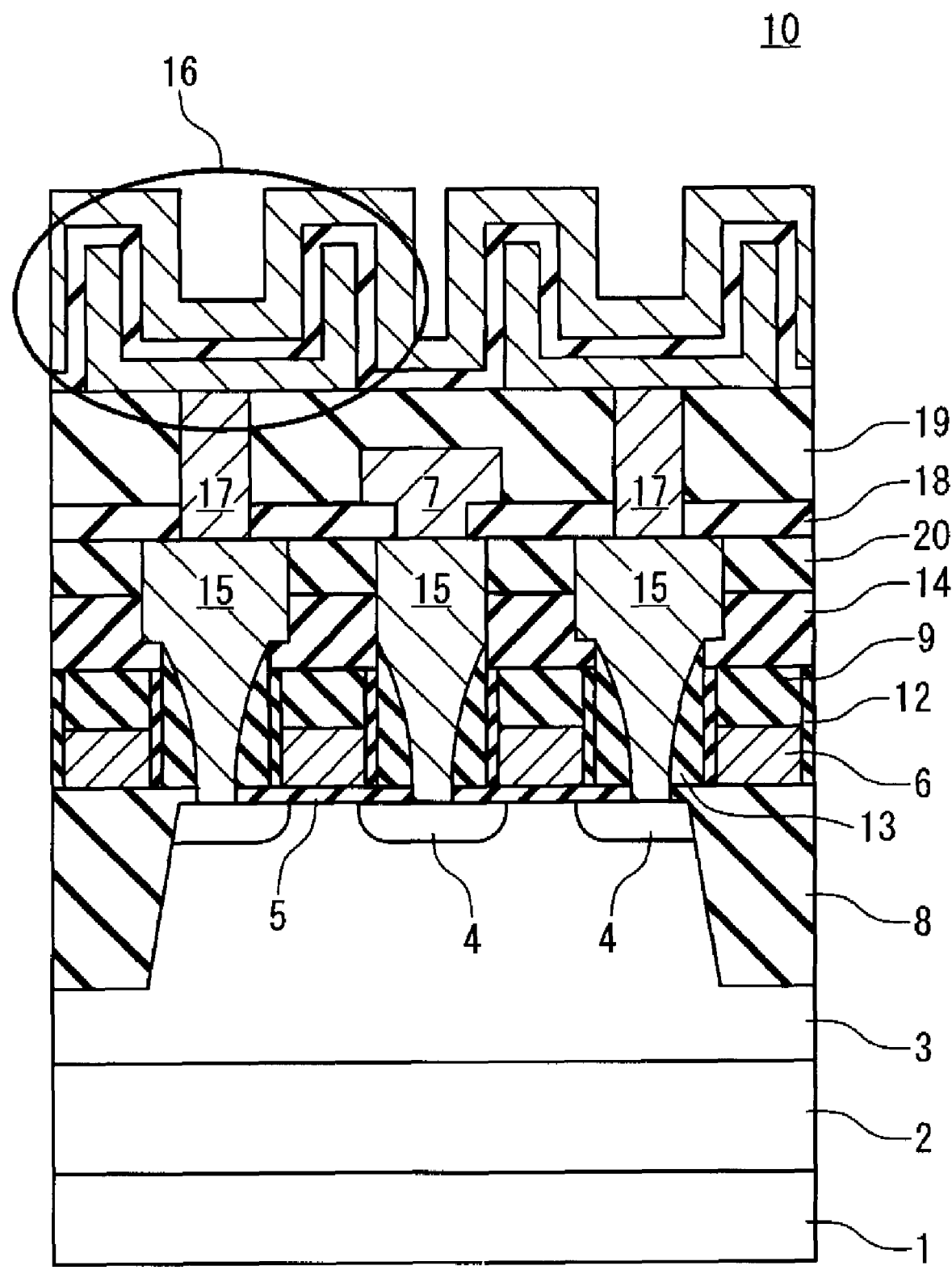
FIG. 1 is a cross-sectional view illustrating a semiconductor device according to a first embodiment of the present invention.

FIG. 1 is a cross-sectional view illustrating a semiconductor device 10 according to a first embodiment of the present invention. In the present embodiment, the semiconductor device 10 is exemplified by a DRAM formed on a p-type semiconductor substrate (silicon substrate) 1. Although FIG. 1 shows a cross section of a memory cell portion of the DRAM, a peripheral circuitry (not shown) is formed around the memory cell portion.

As shown in FIG. 1, a deep n-type well 2 is formed in the p-type semiconductor substrate 1. A shallow p-type well 3 is formed in the deep n-type well 2. Moreover, a memory cell transistor is formed on the shallow p-type well 3. The memory cell transistor is a MOS transistor and has n-type diffusion layers 4, a gate insulating film 5 and a gate electrode 6. The n-type diffusion layers 4 are formed in the p-type well 3 and serves as source/drain.

In FIG. 1, two memory cell transistors sharing one bit line 7 are formed in one active region. The active region is surrounded by an STI (Shallow Trench Isolation) 8. A thermal oxide film 12 is formed on a side surface of the gate electrode 6 in order to improve withstand voltage of the gate insulating film 5. Moreover, a side spacer 13 is formed on the side of the gate electrode 6. A silicon nitride film 9, which is used for processing the gate electrode 6, is formed on the gate electrode 6. Furthermore, a silicon oxide film 14 is formed on the silicon nitride film 9.

Moreover, plugs 15 are so formed as to penetrate a silicon nitride film 20, the silicon oxide film 14 and the gate insulating film 5. One of the plugs 15 connects between the bit line 7 and one of the n-type source/drain diffusion layers 4. Another plug 15 connects between another n-type source/drain diffusion layer 4 and a plug 17. The plug 17 is connected to a capacitor 16. A silicon oxide film 18 is formed between the bit line 7 and the plug 17. Furthermore, a silicon nitride film 19 is formed between the bit line 7 and the capacitor 16.

Figure 2:
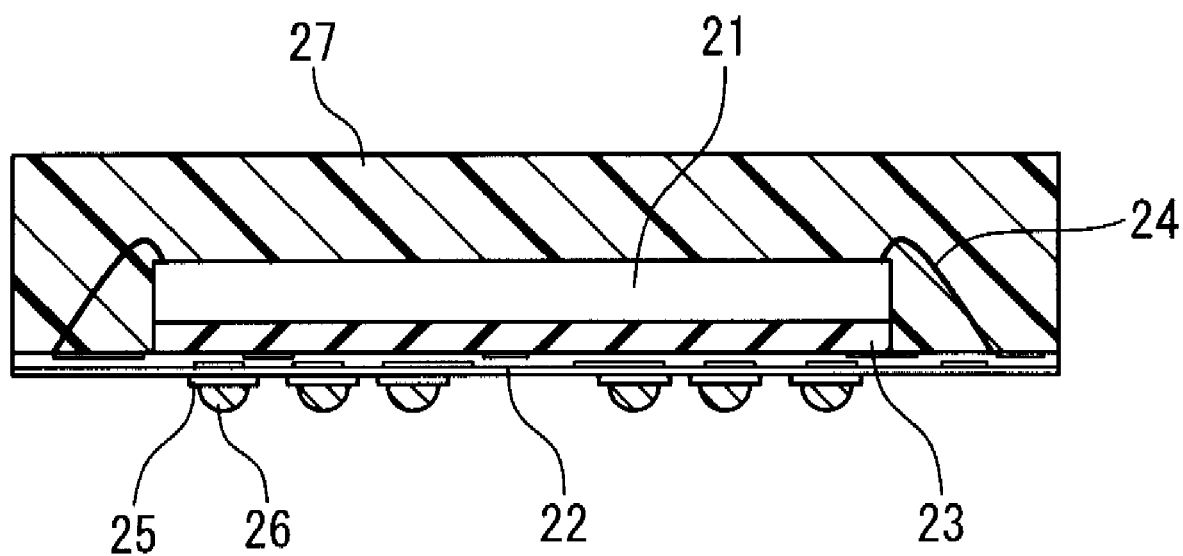
FIG. 2 is a cross-sectional view illustrating a semiconductor device after packaging according to the first embodiment.

FIG. 2 is a cross-sectional view illustrating the semiconductor device 10 after packaging. A semiconductor chip having the above-mentioned structure is produced from a wafer and then packaged. More specifically, a semiconductor chip 21 having the above-described DRAM is attached to one surface of a BGA circuit board 22 with adhesion tape 23. The semiconductor chip 21 is electrically connected to the BGA circuit board 22 through a wire 24. The semiconductor chip 21 and the wire 24 are encapsulated by resin 27. Terminals 25 for use in attaching solder balls are provided on the other surface of the BGA circuit board 22, and solder balls 26 are attached to the terminals 25.

1-2. Manufacturing Method

Figure 3:
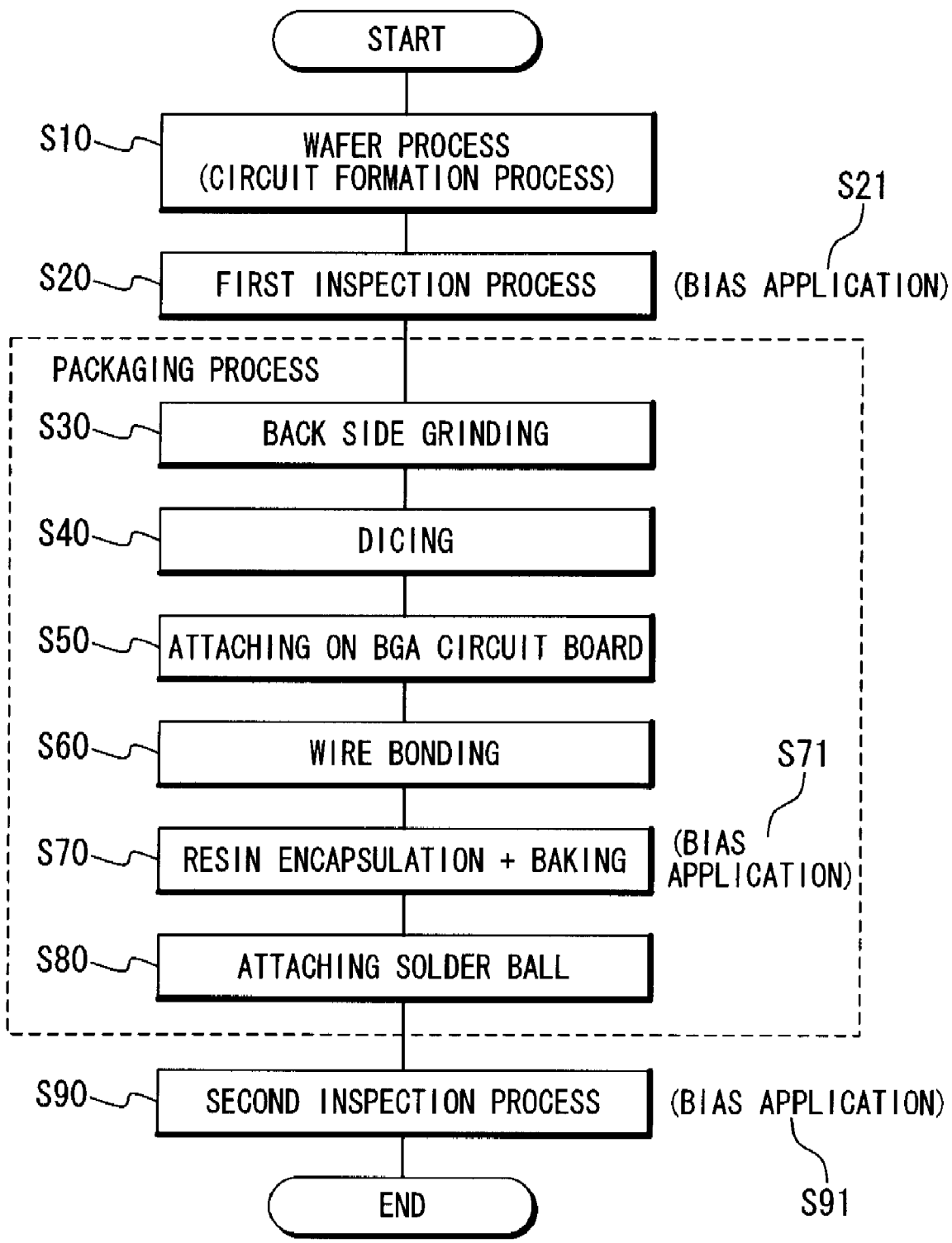
FIG. 3 is a flow chart showing a method of manufacturing the semiconductor device according to the first embodiment.

Next, a method of manufacturing the semiconductor device 10 (semiconductor package) will be explained below. FIG. 3 is a flow chart showing a method of manufacturing the semiconductor device 10 (semiconductor package) according to the present embodiment. The manufacturing method includes: a wafer process (circuit formation process) (Step S10); a first inspection process (Step S20); a back-side grinding process (Step S30); a dicing process (Step S40); a process of attaching on the BGA circuit board (Step S50); a wire bonding process (Step S60); a resin encapsulation and baking process (Step S70); a process of attaching the solder balls (Step S80); and a second inspection process (Step S90). It should be noted that the processes from the Step S30 to the Step S80 may be referred to as a "packaging process".

According to the present embodiment, a "bias application process" is performed during the above-mentioned manufacturing processes. More specifically, the bias application process is performed immediately before the first inspection process (Step S20), in the resin encapsulation and baking process (Step S70) and immediately before the second inspection process (Step S90). The details of each process will be described below.

Step S10; Wafer Process (Circuit Formation Process)

In the wafer process, the circuit structure illustrated in FIG. 1 is formed on a wafer. More specifically, the deep n-type well 2 is formed in the p-type semiconductor substrate 1. The shallow p-type well 3 is formed in the deep n-type well 2. Then, the memory cell transistor is formed on the shallow p-type well 3. Moreover, interconnections and the capacitor are formed. Such the circuit structure can be formed by proving the silicon nitride film and the silicon oxide film, patterning them, implanting ions and so forth. As a result of the wafer process, the semiconductor device in the wafer state in which the circuit structure is formed on the p-type semiconductor substrate 1 is obtained.

Step S20; First Inspection Process

Subsequently, a characteristic inspection is performed with respect to the wafer, i.e. the semiconductor device in the wafer state. Typically, a continuity test is carried out as the characteristic inspection. According to the present embodiment, a bias application process (Step S21) is added before the continuity test. That is, a bias application process is performed after the wafer process (Step S10) and before the first inspection process (Step S20).

Step S21; Bias Application Process

In the present bias application process (Step S21), a forward bias is applied between the shallow p-type well 3 and the deep n-type well 2. The bias may be applied through an external input terminal. Alternatively, the bias application can be achieved by a built-in circuit.

Figure 4:
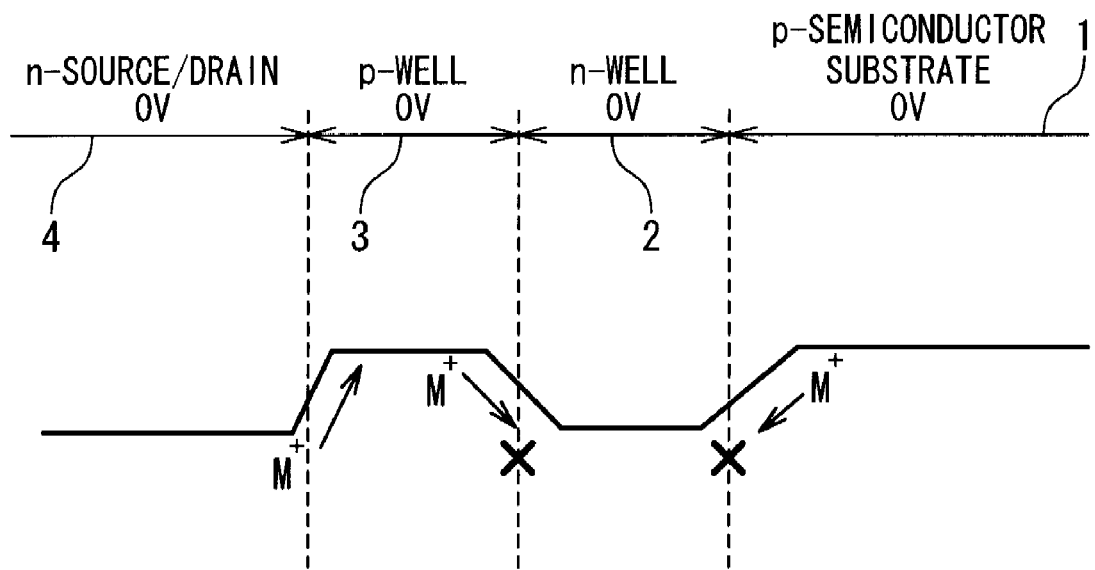
FIG. 4 is a schematic diagram showing an energy state under a condition that no bias is applied.

An effect of the bias application process will be described below with reference to FIG. 4 and FIG. 5. FIG. 4 is a schematic diagram showing potential energy of each layer under a condition that no bias is applied. As shown in FIG. 4, the potential energy is higher in the shallow p-type well 3 than in the n-type source/drain diffusion layer 4 due to built-in potential (diffusion potential). Similarly, the potential energy is higher in the shallow p-type well 3 than in the deep n-type well 2. Moreover, the potential energy is higher in the p-type semiconductor substrate 1 than in the deep n-type well 2.

The heavy metal ion $M^+$ that causes increase in the junction leakage current is copper (Cu) ion, nickel (Ni) ion or the like, and is positively ionized. Therefore, the heavy metal ion $M^+$ existing in a depletion layer around an interface between the n-type source/drain diffusion layer 4 and the shallow p-type well 3 moves toward the side of the shallow p-type well 3 having the higher potential energy. However, the heavy metal ion $M^+$ transferred to the shallow p-type well 3 does not further move into the deep n-type well 2, because the potential energy is lower in the deep n-type well 2 than in the shallow p-type well 3.

Figure 5:
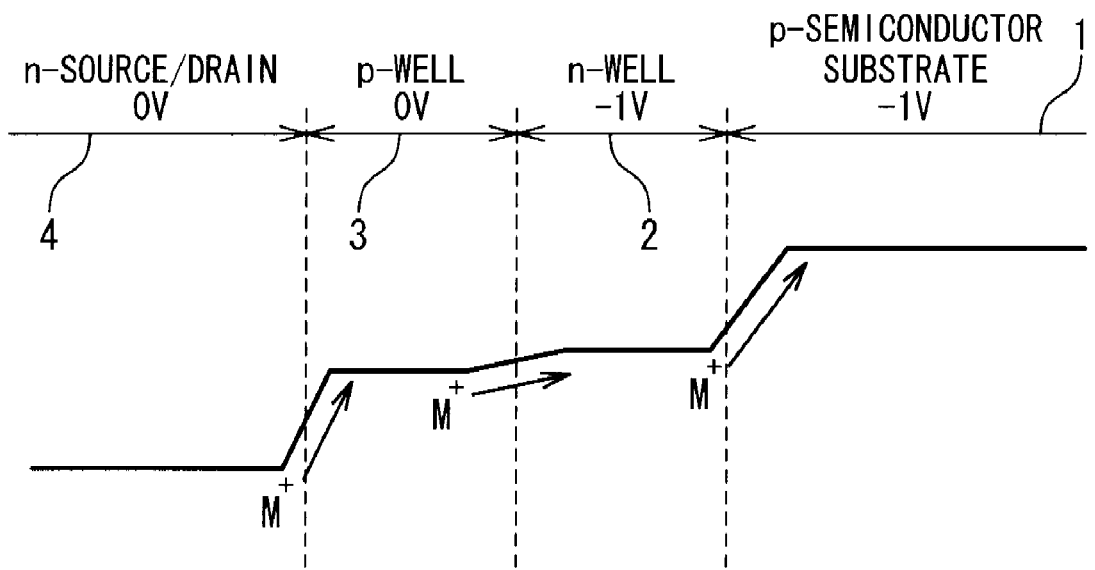
FIG. 5 is a schematic diagram showing an example of an energy state at a time of a bias application process.

On the other hand, FIG. 5 shows an example of potential energy under a condition that a forward bias is applied. In the example shown in FIG. 5, only the forward bias is applied between the shallow p-type well 3 and the deep n-type well 2. Although the potential energy is higher in the shallow p-type well 3 than in the deep n-type well 2 in FIG. 4, the relation is reversed due to the forward bias application in the example shown in FIG. 5. That is, the potential energy is higher in the deep n-type well 2 than in the shallow p-type well 3 when the forward bias is applied. As for the relation between the n-type source/drain layer 4 and the shallow p-type well 3 and the relation between the deep n-type well 2 and the p-type semiconductor substrate 1 where no bias is applied, the same as in FIG. 4 is applied to the case in FIG. 5.

Since the potential energy is higher in the deep n-type well 2 than in the shallow p-type well 3, the heavy metal ion $M^+$ transferred to the shallow p-type well 3 further moves into the deep n-type well 2. Further, the heavy metal ion $M^+$ attracted to the deep n-type well 2 moves into the p-type semiconductor substrate 1 with the higher potential energy. Even when the energy state at each layer returns to the state shown in FIG. 4 after the bias application is completed, the heavy metal ion $M^+$ attracted to the p-type semiconductor substrate 1 is not drawn back to the n-type well 2 with the lower potential energy. In this manner, the heavy metal ion $M^+$ is eliminated from around the p-n junction between the n-type source/drain diffusion layer 4 and the p-type well 3. As a result, the p-n junction leakage current can be suppressed.

Figure 6:
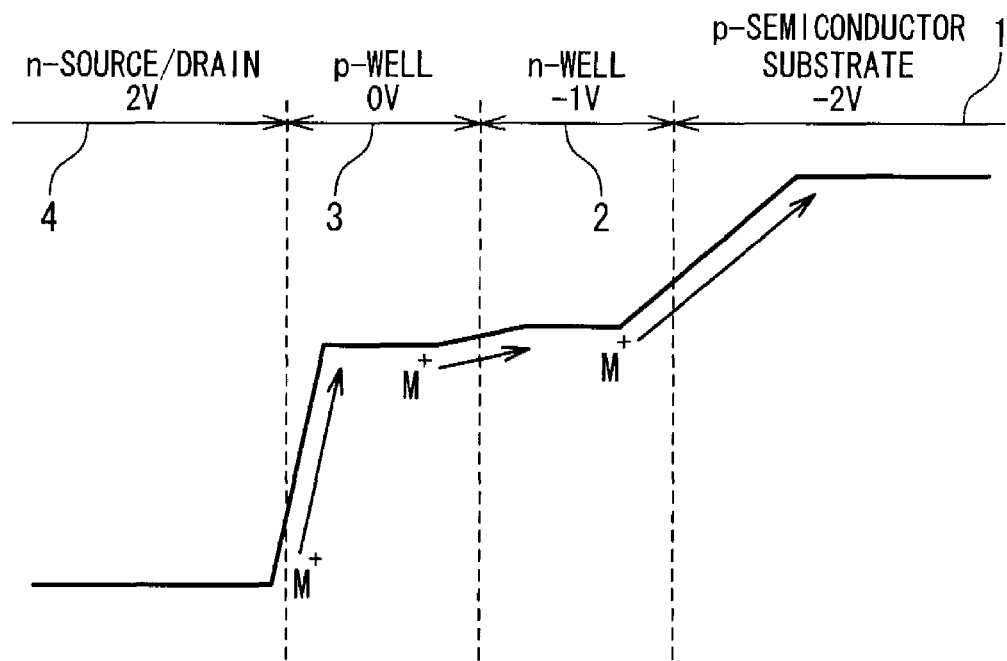
FIG. 6 is a schematic diagram showing another example of an energy state at a time of a bias application process.

In the above example shown in FIG. 5, only the forward bias is applied between the shallow p-type well 3 and the deep n-type well 2. FIG. 6 shows another example of the bias application process. In FIG. 6, a reverse bias is applied between the shallow p-type well 3 and the n-type source/drain diffusion layer 4. Moreover, another reverse bias is applied between the p-type semiconductor substrate 1 and the deep n-type well. The energy difference exists between the n-type source/drain diffusion layer 4 and the p-type well 3 due to the built-in potential as shown in FIGS. 4 and 5, and such the energy difference is further enlarged due to the reverse bias application as shown in FIG. 6. Consequently, the heavy metal ion $M^+$ existing in the depletion layer around the interface between the n-type source/drain diffusion layer 4 and the shallow p-type well 3 moves faster to the shallow p-type well 3. Similarly, the heavy metal ion $M^+$ attracted to the deep n-type well 2 moves faster to the p-type semiconductor substrate 1. That is to say, the elimination of the heavy metal ion $M^+$ can be achieved in a shorter time.

The movement (migration) of the heavy metal ion is promoted as the temperature of the wafer during the bias application process (Step S21) becomes higher. However, if the temperature is too high, it may cause change in characteristics of the MOS transistor. In the present embodiment, the temperature is set in a range from 80 to 100 degrees centigrade that is used in the normal operation test.

Figure 7:
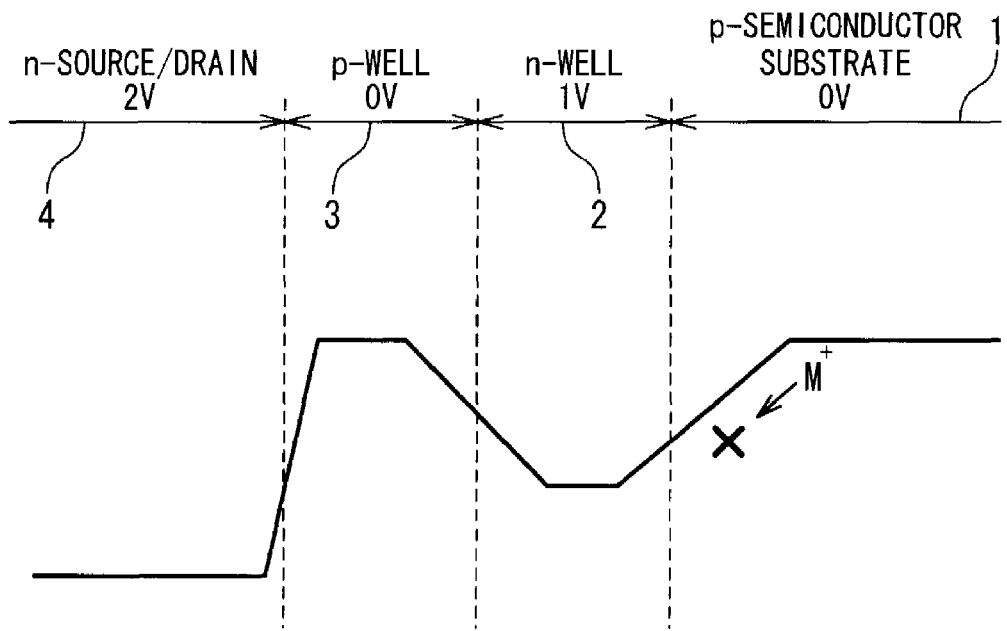
FIG. 7 is a schematic diagram showing an example of an energy state at a time of a normal operation in a characteristic inspection.

After the bias application process (Step S21), the first characteristic inspection is performed as usual. At the time of the characteristic inspection, a reverse bias is applied between the n-type source/drain diffusion layer 4 and the shallow p-type well 3. Another reverse bias is applied between the shallow p-type well 3 and the deep n-type well 2. Still another reverse bias is applied between the deep n-type well 2 and the p-type semiconductor substrate 1. The energy state of each layer is schematically shown in FIG. 7. As shown in FIG. 7, the potential energy is lower in the n-type well 2 than the p-type semiconductor substrate 1. Therefore, the heavy metal ion $M^+$ attracted to the p-type semiconductor substrate 1 in the above-mentioned bias application process (Step S21) is not drawn back to the n-type well 2. In other words, the heavy metal ion M$^+$ does not return to the depletion layer around the interface between the n-type source/drain diffusion layer 4 and the p-type well 3.

After the characteristic inspection, the bias application quits. Even when the bias application quits, the heavy metal ion M$^+$ does not return back to the n-type source/drain diffusion layer 4, because the potential difference due to the built-in potential exists between the p-type semiconductor substrate 1 and the n-type well 2.

Step S30; Back-Side Grinding

Returning back to FIG. 3 again, the explanation of the method of manufacturing the semiconductor device will be continued. After the first inspection process (Step S20), the packaging process starts. First, the back side grinding is performed with respect to the semiconductor device 10 in the wafer state after the characteristic inspection. The back side grinding is performed in order to set the thickness of the wafer to a predetermined value.

Step S40; Dicing

Next, dicing of the wafer is performed. As a result, the semiconductor chip 21 having the semiconductor device 10 is produced.

Step S50; Attaching on BGA Circuit Board

The semiconductor chip 21 produced by the dicing is attached on the BGA circuit board 22 with the adhesion tape 23.

Step S60; Wire Bonding

An electrode pad of the semiconductor chip 21 is connected to an electrode pad of the BGA circuit board 22 through the wire 24.

Step S70; Resin Encapsulation and Baking

Subsequently, resin encapsulation of the semiconductor chip 21 is performed by using the resin 27. After that, a baking process is carried out. At the time of the baking, another bias application process (Step S71) is performed. The bias at the Step S71 can be applied through the terminals 25 of the BGA circuit board 22. The bias applied in the present bias application process (Step S71) is the same as that in the foregoing bias application process (Step S21). That is to say, the forward bias is applied between the p-type well 3 and the n-type well 2. Moreover, the reverse bias may be applied between the n-type source/drain diffusion layer 4 and the p-type well 3 and/or between the n-type well 2 and the p-type semiconductor substrate 1. It should be noted that the baking is performed under a high-temperature state. Therefore, if the large bias application is carried out for a long time, it may cause change in characteristics of the MOS transistor. Depending on the temperature and the time of the baking process, the reverse bias may not applied between the n-type source/drain diffusion layer 4 and the p-type well 3 and/or between the n-type well 2 and the p-type semiconductor substrate 1. In other words, there are times when only the forward bias application is preferable.

Step S80; Attaching Solder Ball

Subsequently, the solder balls 26 are attached to the terminals 25 of the BGA circuit board 22 through a reflow.

Step S90; Second Inspection Process

Next, another characteristic inspection is performed with respect to the semiconductor package (semiconductor chip 21) after the packaging process (Step S30 to S80). Here, still another bias application process (Step S91) is performed before the characteristic inspection, as in the case of the first inspection process (Step S20). The bias applied in the present bias application process (Step S91) is the same as that in the foregoing bias application process (Step S21), and its explanation will be omitted. After the bias application process (Step S91) is completed, the characteristic inspection is carried out. In the present characteristic inspection, the same bias as in the foregoing characteristic inspection process (Step S20) is applied (see FIG. 7).

By the above-described processes (Step S10 to S90), the semiconductor device 10 (semiconductor package) having the DRAM is manufactured.

1-3. Effects

According to the present embodiment, as described above, the forward bias is applied between the deep n-type well 2 and the shallow p-type well 3. Consequently, the heavy metal ion M$^+$ in the depletion layer around the interface between the shallow p-type well 2 and the n-type source/drain diffusion layer 4 is attracted and moved to the p-type semiconductor substrate 1. Since there exists the energy barrier, the heavy metal ion M$^+$ once attracted to the semiconductor substrate 1 does not return back to the n-type source/drain diffusion layer 4. Therefore, the p-n junction leakage current is suppressed and thus the yield is improved.

The deterioration of the yield due to the junction leakage current at the first inspection process (Step S20) can be suppressed by performing the bias application process (Step S21) prior to the first inspection process (Step S20). Moreover, the deterioration of the yield due to the junction leakage current at the second inspection process (Step S90) can be suppressed by performing the bias application process (Step S71) during the packaging process (Step S30 to S80) and/or by performing the bias application process (Step S91) prior to the second inspection process (Step S90).

Although the bias application process is performed for three times (Step S21, S71, S91) in the present embodiment, not all the three bias application processes may be necessary. The bias application process is performed for at least one time after the wafer process (Step S10) and before the second inspection process (Step S90). In this case, the effect of the elimination of the heavy metal ion can be obviously obtained at least at the second inspection process (Step S90).

2. Second Embodiment 2-1. Structure

Next, a second embodiment of the present invention will be described. According to the present embodiment, a heavy metal gettering site (11, 31) is added to the semiconductor device 10, as compared with the structure in the first embodiment. In the present embodiment, the same reference numerals are given to the same components as those described in the first embodiment, and an overlapping description will be appropriately omitted.

Figure 8:
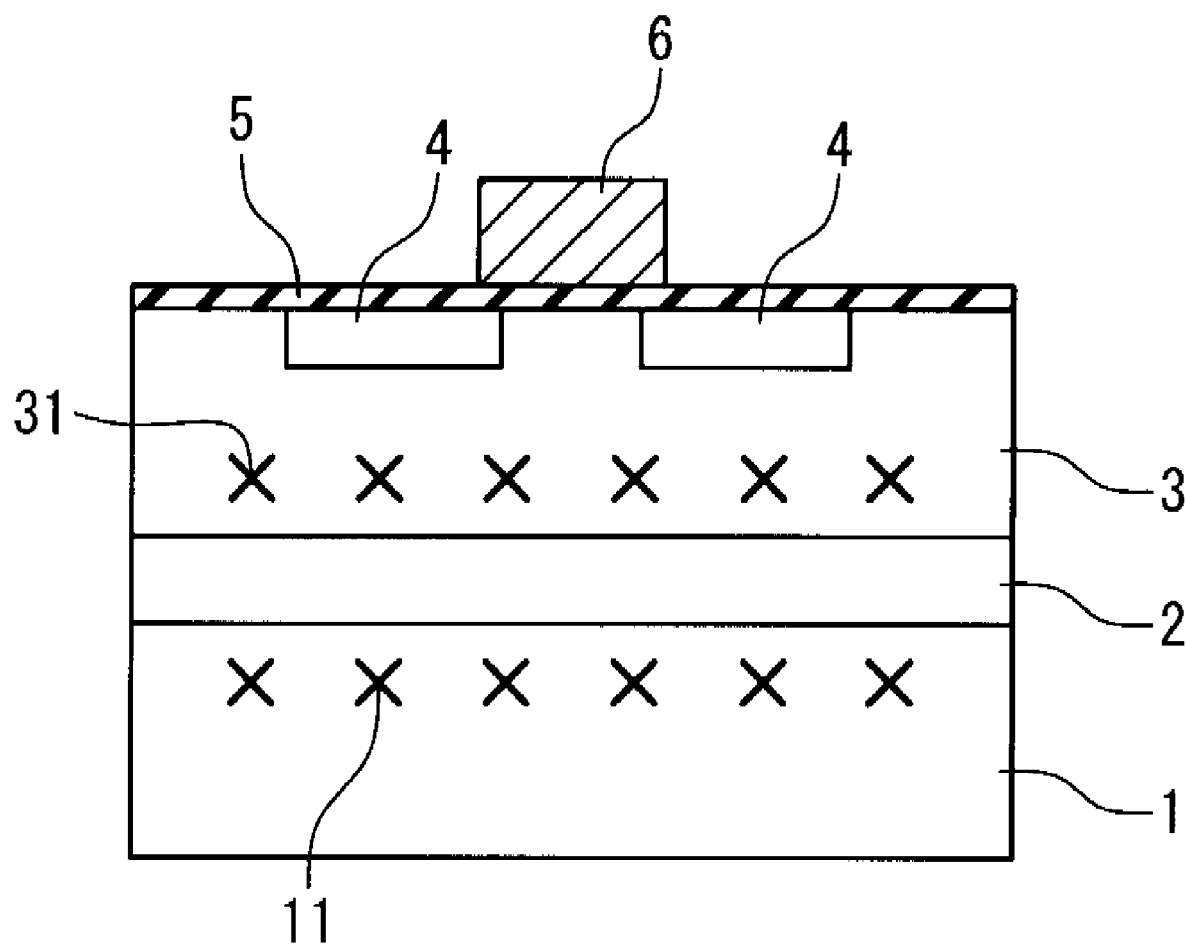
FIG. 8 is a cross-sectional view schematically illustrating a semiconductor device according to a second embodiment of the present invention.

FIG. 8 is a cross-sectional view schematically illustrating the semiconductor device 10 according to the present embodiment. Shown in FIG. 8 are the p-type semiconductor substrate 1, the deep n-type well 2, the shallow p-type well 3 and the memory cell transistor (4, 5, 6).

Under a bias condition in the normal operation, a depletion layer 28 (not shown in FIG. 8, see FIG. 9) is formed around the interface between the p-type semiconductor substrate 1 and the deep n-type well 2. A heavy metal gettering site 11 is formed adjacent to the depletion layer 28 and on the side of the p-type semiconductor substrate 1. That is, the heavy metal gettering site 11 is provided within the p-type semiconductor substrate 1.

Moreover, similarly to the depletion layer 28, a depletion layer 29 (not shown in FIG. 8, see FIG. 9) is formed around the interface between the deep n-type well 2 and the shallow p-type well 3 under the bias condition in the normal operation. It is preferable that a heavy metal gettering site 31 is formed adjacent to the depletion layer 29 and on the side of the shallow p-type well 3. That is, the heavy metal gettering site 31 is preferably provided within the shallow p-type well 3.

Figure 9:
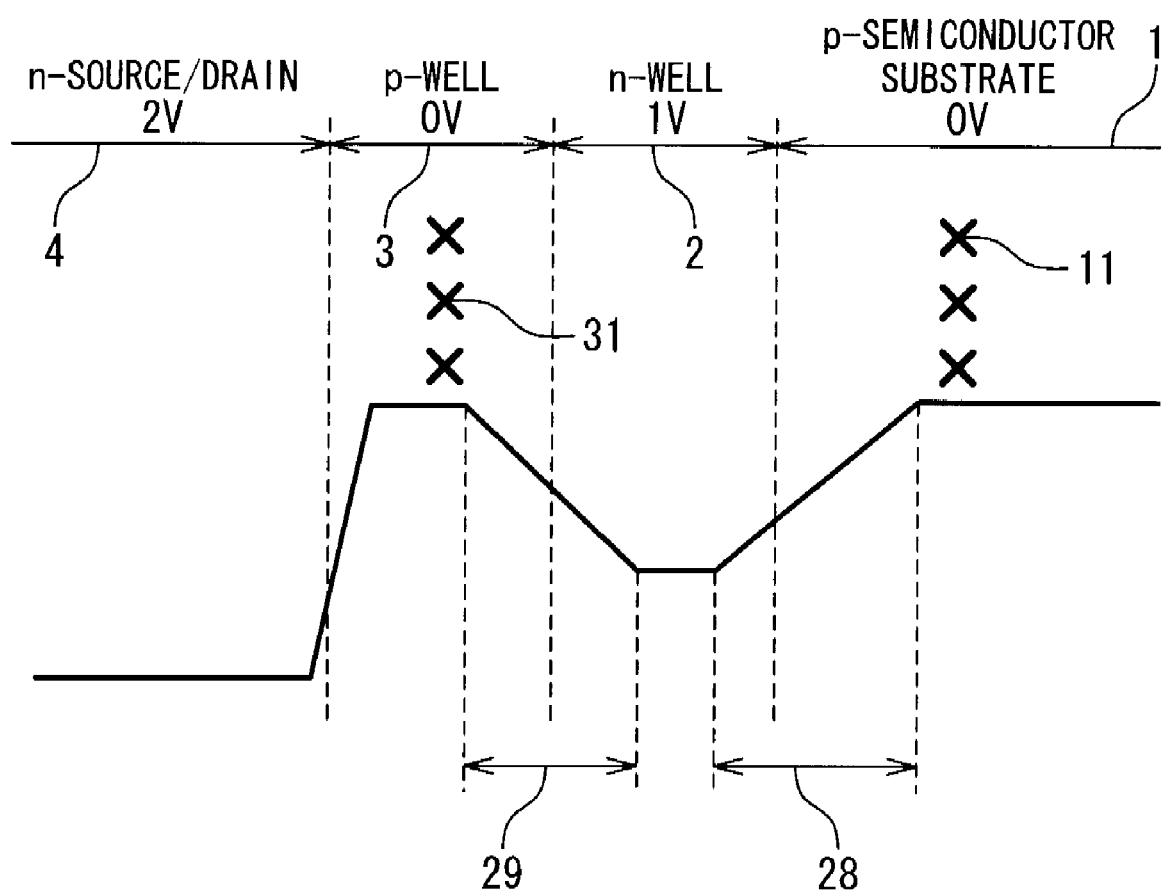
FIG. 9 is a schematic diagram showing an example of an energy state at a time of a normal operation in a characteristic inspection according to the second embodiment.

The heavy metal gettering sites 11, 31 trap the transferred heavy metal ion $M^+$ and restrict its movement. FIG. 9 is a schematic diagram for explaining the trapping of the heavy metal ion $M^+$ by the heavy metal ion gettering sites 11, 31. Shown in FIG. 9 is the energy state of each layer at a time of the normal operation in the characteristic inspection. A reverse bias is applied between the n-type source/drain diffusion layer 4 and the shallow p-type well 3. Another reverse bias is applied between the shallow p-type well 3 and the deep n-type well 2. Still another reverse bias is applied between the deep n-type well 2 and the p-type semiconductor substrate 1. The heavy metal ion $M^+$ in the depletion layer around the interface between the source/drain diffusion layer 4 and the p-type well 3 is attracted to the p-type well 3 and is trapped by the heavy metal gettering site 31. Also, the heavy metal ion $M^+$ transferred from the n-type well 2 to the p-type semiconductor substrate 1 is trapped by the heavy metal gettering site 11. The heavy metal ion $M^+$ trapped by the heavy metal gettering sites 11, 31 does not return back to the n-type source/drain diffusion layer 4. In this manner, the heavy metal ion $M^+$ is more surely eliminated from the depletion layer around the interface between the source/drain diffusion layer 4 and the p-type well 3. Thus, the p-n junction leakage current is reduced and the yield is improved.

Each of the heavy metal gettering sites 11, 31 can be provided by forming an oxygen precipitate region where oxygen is precipitated. The oxygen precipitate region can be formed, for example, by performing a low-temperature heat treatment, forming precipitate nucleation due to implantation damage and performing a high-temperature heat treatment for the purpose of the oxygen precipitation to the precipitate nucleation.

Alternatively, each of the heavy metal gettering sites 11, 31 may be provided by forming a lattice distorted section where crystal lattice is distorted. In a case where the heavy metal ion $M^+$ is nickel (Ni) ion, for example, the lattice distorted section can be formed by shrinking the crystal lattice. The Ni ion is trapped at the shrunken crystal lattice. In order to form the shrunken crystal lattice, for example, the boron (B) concentration is made higher than the surrounding section, or titanium silicide is formed in the surrounding section. On the other hand, in a case where the heavy metal ion $M^+$ is copper (Cu) ion, the lattice distorted section can be formed by expanding the crystal lattice. The Cu ion is trapped at the expanded crystal lattice. In order to form the expanded crystal lattice, for example, carbon (C) is introduced into the surrounding section.

2-2. Manufacturing Method

Figure 10:
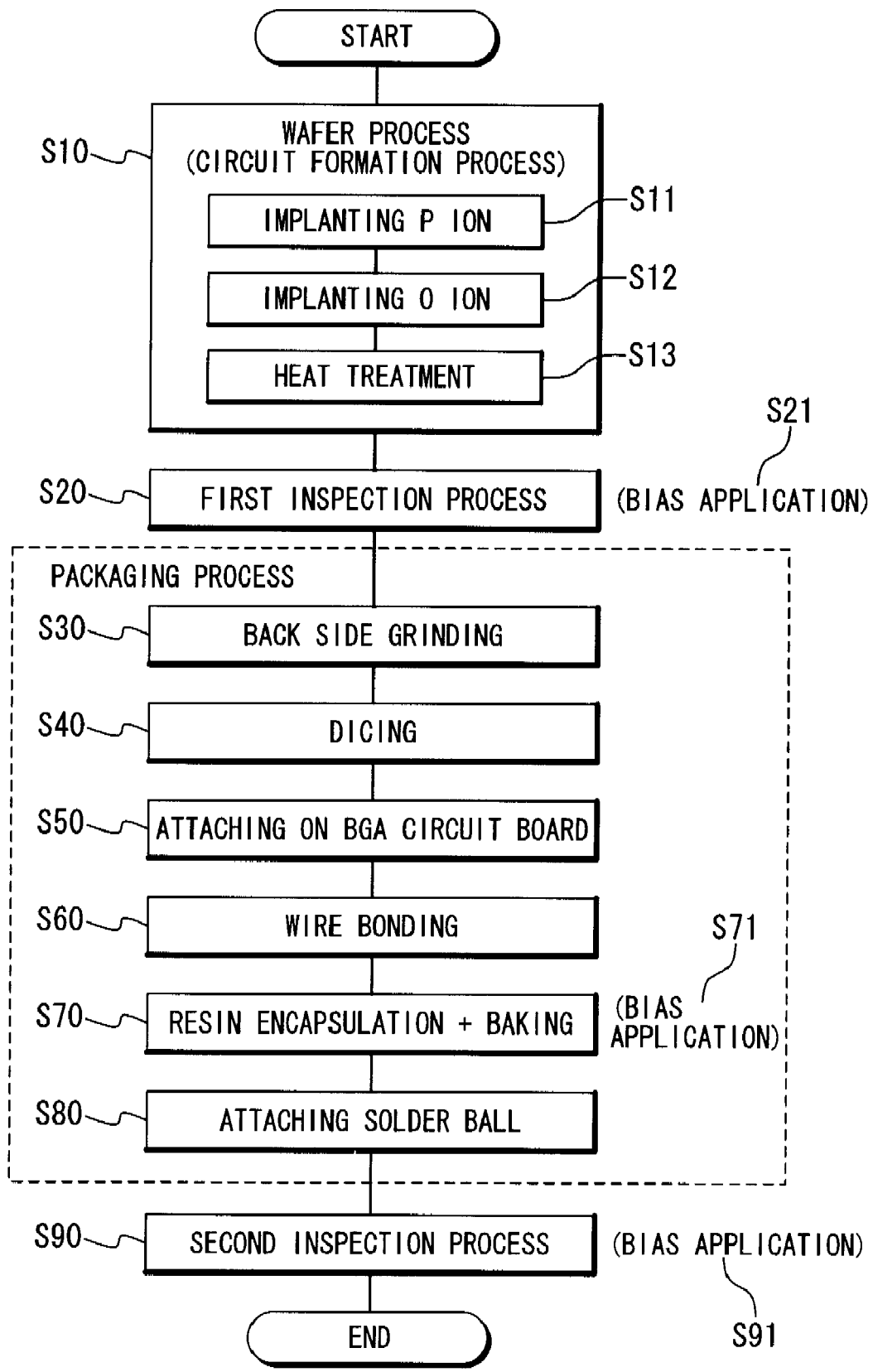
FIG. 10 is a flow chart showing a method of manufacturing the semiconductor device according to the second embodiment.

FIG. 10 is a flow chart showing a method of manufacturing the semiconductor device 10 (semiconductor package) according to the present embodiment. Described in the present embodiment is a case where the heavy metal gettering site 11 is provided by forming the oxygen precipitate region. The wafer process (Step S10) in the present embodiment is different from that in the first embodiment. The processes other than the wafer process (Step S10) are similar to those in the first embodiment, and an overlapping description will be appropriately omitted. In the present embodiment, the wafer process (Step S10) further includes: phosphorus (P) ion implanting process (Step S11); oxygen (O) ion implanting process (Step S12); and a heat treatment process (Step S13).

Step S11; Implanting P Ion

The wafer process (circuit formation process) includes a process of implanting P ions in order to form the deep n-type well 2. In the Step S11, the P ions are implanted into the p-type semiconductor substrate 1.

Step S12; Implanting O Ion

After the P ion implanting process, O ions are implanted for the purpose of forming the heavy metal gettering site. The O ions are implanted into the p-type semiconductor substrate 1 deeper than the deep n-type well 2.

Step S13; Heat Treatment

Subsequently, a heat treatment is performed in order to recover the damage at the time of P ion implanting process.

By the above-described processes (Step S11 to S13), the heavy metal gettering site 11 is formed. The O ion implanting process (Step S12) can be performed prior to the P ion implanting process (Step S11) as long as it is performed prior to the heat treatment (Step S13). The O ion implanting process (Step S12) makes precipitate nucleation due to implantation damage. In the heat treatment (Step S13) for recovering the damage by the Step S11, the oxygen precipitation also occurs based on the precipitate nucleation. Thus, the heavy metal gettering site including the oxygen precipitate region is formed.

2-3. Effects

According to the present embodiment, the heavy metal gettering site (11, 31) is provided in at least one of the p-type semiconductor substrate 1 and the p-type well 3. The heavy metal ion $M^+$ attracted to the p-type well 3 and/or the p-type semiconductor substrate 1 is captured by the heavy metal gettering site. The heavy metal ion $M^+$ does not return back to the depletion layer around the interface between the n-type source/drain diffusion layer 4 and the p-type well 3. Therefore, the p-n junction leakage current is suppressed and the yield is improved.

In the bias application process (Step S21, S71, S91), the heavy metal ion $M^+$ is transferred toward the side of the p-type semiconductor substrate 1, as described above. At this time, the transferred heavy metal ion $M^+$ is captured by the heavy metal gettering site (11, 31). The elimination of the heavy metal ion $M^+$ is more surely achieved by providing the heavy metal gettering site (11, 31) and performing the bias application process (Step S21, 71, 91).

Moreover, when the heavy metal gettering site (11, 31) is provided, the migration length of the heavy metal ion $M^+$ becomes shorter, which can reduce the time for the bias application process. According to a conventional heavy metal gettering method, a heavy metal gettering site is formed at a deep portion of the p-type semiconductor substrate 1. In contrast, according to the present embodiment, the heavy metal gettering site is provided at a position near the n-type well 2. Therefore, the migration length of the heavy metal ion $M^+$ becomes shorter and thus the time for the bias application process is reduced.

3. Verification

In order to explain the effect of the present invention in numerical view, results of experiments performed by the inventor will be described below. FIG. 11 shows several experimental conditions (Example-1, Example-2, Example-3, Comparative Example) and the corresponding results. In FIG. 11, a "circle" denotes that the bias application process (Step S21, S71, S91) is performed or the heavy metal gettering site is formed, while a "cross" denotes that the bias application is not performed or the heavy metal gettering site is not provided.

EXAMPLE-1

First, the DRAM illustrated in FIG. 1 was manufactured. Then, the bias application process (Step S21) was performed before the characteristic inspection of the wafer (Step S20: the first inspection process). As shown in FIG. 6, voltages of 2 V, 0 V, −1 V and −2 V were applied to the n-type source/drain diffusion layer 4, the shallow p-type well 3, the deep n-type well 2 and the p-type semiconductor substrate 1, respectively. That is to say, a reverse bias was applied between the n-type source/drain diffusion layer 4 and the p-type well 3, a forward bias was applied between the p-type well 3 and the n-type well 2, and a reverse bias was applied between the n-type well 2 and the p-type semiconductor substrate 1. The temperature during the bias application was set to a range from 80 to 100 degrees centigrade that are usually used in an operation test. After the bias application process, the operation test was performed (Step S20) and the yield was checked. As a result, the fraction defective was 0.2%.

Subsequently, the wafer back-side grinding process (Step S30) is performed. As a result, the thickness of the wafer was reduced from 760 micrometers to 70 micrometers. At this time, copper (Cu) of $1*10^{11}/cm^2$ and nickel (Ni) of $5*10^{10}/cm^2$ were attached to the back-side of the wafer. After that, the dicing process (Step S40) was performed and the DRAM chip was obtained. The DRAM chip was attached on the BGA circuit board with the adhesion tape (Step S50) and the resin encapsulation was performed. Then, the baking at 180 degrees centigrade was carried out for several hours (Step S70).

During the baking process, the bias was applied through the terminals 25 for the solder ball attachment (Step S71). More specifically, the n-type source/drain diffusion layer 4 and the p-type semiconductor substrate 1 were set to the floating state, and voltages of 0 V and −1 V were applied to the shallow p-type well 3 and the deep n-type well 2, respectively.

Subsequently, the solder ball 26 was attached by the reflow (Step S80). After that, the operation test of the characteristic inspection after the packaging (Step S90: the second inspection process) was performed and the yield was checked. As a result, the fraction defective was 1.0%.

EXAMPLE-2

In the Example-2, the bias application process (Step S91) was further performed prior to the operation test of the characteristic inspection (Step S90: the second inspection process). The other conditions were the same as those in the Example-1.

In the Step S91, a voltage of 3.5 V was applied to the gate electrode 6 and the memory cell transistor was turned ON. A voltage of 2 V was applied to the n-type source/drain diffusion layer 4 connected to the bit line 7 through the plug 15. Also, a voltage of 2 V was applied to the n-type source/drain diffusion layer 4 connected to the capacitor 16. Voltages of 0 V, −1 V and −2 V were applied to the shallow p-type well 3, the deep n-type well 2 and the p-type semiconductor substrate 1, respectively (see FIG. 6). That is to say, a reverse bias was applied between the n-type source/drain diffusion layer 4 and the p-type well 3, a forward bias was applied between the p-type well 3 and the n-type well 2, and a reverse bias was applied between the n-type well 2 and the p-type semiconductor substrate 1. The temperature during the bias application was set to a range from 80 to 100 degrees centigrade that are usually used in the operation test. After the bias application process, the operation test was performed (Step S90) and the yield was checked. As a result, the fraction defective at the second inspection process was 0.5%.

EXAMPLE-3

In the Example-3, the heavy metal gettering site 11 was further formed as compared with the Example-2. The heavy metal gettering site 11 was provided at a position near the n-type well 2 in the p-type semiconductor substrate 1. The heavy metal gettering site 11 was formed as follows. After P ions were implanted for forming the deep n-type well 2, O ions of $1*10^{15}/cm^2$ were implanted. After that, the heat treatment was carried out for the damage recovery. As in the Example-1 and the Example-2, the yields at the first inspection process (Step S20) and the second inspection process (Step S90) were checked. As a result, the fraction defective at the first inspection process was 0.1%, and the fraction defective at the second inspection process was also 0.1%.

COMPARATIVE EXAMPLE

In the Comparative Example, the above-mentioned bias application process was not carried out, and the above-mentioned heavy metal gettering site was not formed. Similarly, the yields at the first inspection process (Step S20) and the second inspection process (Step S90) were checked. As a result, the fraction defective at the first inspection process was 1%, and the fraction defective at the second inspection process was 5%.

As can be seen from the above-described experimental results, the fraction defective at the first inspection process (Step S20) is reduced from 1% to 0.2% by performing the bias application process (Step S21) before the first inspection process. Moreover, the fraction defective at the second inspection process (Step S90) is reduced from 5% to 1% by performing the bias application process (Step S71) in the packaging process before the second inspection process. Furthermore, the fraction defective at the second inspection process (Step S90) is further reduced to 0.5% by performing the bias application process (Step S91) after the packaging process and before the second inspection process. In other words, by performing the bias application process, the yield in the wafer state can be improved by 0.8% and the yield after the packaging can be improved by 4 to 4.5%. Moreover, the fraction defective can be further reduced by providing the heavy metal gettering site as in the Example-3.

A synergy effect can be obtained by combining the bias application process and the heavy metal gettering site. However, it should be noted that only the bias application process or only the heavy metal gettering site is also effective, which would be obvious to the person skilled in the art.

In the foregoing embodiments, the DRAM was explained as an example. Needless to say, the present invention can be applied to a semiconductor device such as an SRAM, a logic-type and the like.

It is apparent that the present invention is not limited to the above embodiment and may be modified and changed without departing from the scope and spirit of the invention.

What is claimed is:

1. A method of manufacturing a semiconductor device comprising:
   forming a n-type well in a p-type semiconductor substrate;
   forming a p-type well in said n-type well;

forming a transistor on said p-type well, said transistor having a n-type source/drain diffusion layer; and applying a forward bias between said p-type well and said n-type well to remove heavy metal ions from a p-n junction between said p-type well and said n-type well, formed during at least one of the forming of the n-type well, the forming of the p-type well, and the forming of the transistor.

2. The method according to claim 1, further comprising:
applying a reverse bias between said p-type well and said n-type source/drain diffusion layer.

3. The method according to claim 2,
wherein removal of said heavy metal ions comprises transferring said heavy metal ions from said n-type source/drain diffusion layer to said p-type well by applying said reverse bias.

4. The method according to claim 1, further comprising: applying a reverse bias between said p-type semiconductor substrate and said n-type well.

5. The method according to claim 4,
wherein removal of said heavy metal ions comprises transferring said heavy metal ions from said n-type well to said p-type semiconductor substrate by applying said reverse bias.

6. The method according to claim 1, further comprising:
applying a reverse bias between said p-type well and said n-type source/drain diffusion layer; and
applying a reverse bias between said p-type semiconductor substrate and said n-type well.

7. The method according to claim 6,
wherein removal of said heavy metal ions comprises transferring said heavy metal ions from said n-type source/drain diffusion layer to said p-type semiconductor substrate by applying said forward bias and said reverse bias.

8. The method according to claim 1, further comprising:
inspecting circuit characteristics of the semiconductor device after applying the forward bias between said p-type well and said n-type well.

9. The method according to claim 1,
wherein said creation of the semiconductor device further includes: forming a heavy metal gettering site in at least one of said p-type semiconductor substrate and a p-type well.

10. The method according to claim 9, further comprising:
applying a reverse bias between said p-type well and said n-type source/drain diffusion layer.

11. The method according to claim 10,
wherein removal of said heavy metal ions comprises transferring said heavy metal ions from said n-type source/drain diffusion layer to said p-type well by applying said reverse bias.

12. The method according to claim 9, further comprising:
applying a reverse bias between said p-type semiconductor substrate and said n-type well.

13. The method according to claim 12,
wherein removal of said heavy metal ions comprises transferring said heavy metal ions from said n-type well to said p-type semiconductor substrate by applying said reverse bias.

14. The method according to claim 9, further comprising:
applying a reverse bias between said p-type well and said n-type source/drain diffusion layer; and
applying a reverse bias between said p-type semiconductor substrate and said n-type well.

15. The method according to claim 14,
wherein removal of said heavy metal ions comprises transferring said heavy metal ions from said n-type source/drain diffusion layer to said p-type semiconductor substrate by applying said forward bias and said reverse bias.

16. The method according to claim 9, further comprising:
inspecting circuit characteristics of the semiconductor device after applying the forward bias between said p-type well and said n-type well.

17. The method according to claim 1,
wherein removal of said heavy metal ions comprises transferring said heavy metal ions from said p-type well to said n-type well by applying said forward bias.

18. A method of manufacturing a semiconductor device in a semiconductor wafer comprising:
forming a n-type well in a p-type semiconductor substrate within said semiconductor wafer;
forming a p-type well in said n-type well;
forming a transistor on said p-type well, said transistor having a n-type source/drain diffusion layer;
inspecting circuit characteristics of the semiconductor device;
dicing said semiconductor wafer to produce a semiconductor chip and packaging said semiconductor chip; and
inspecting circuit characteristics of said semiconductor chip,
wherein a forward bias between said p-type well and said n-type well to remove heavy metal ions from a p-n junction between said p-type well and said n-type well, formed during at least one of the forming of the n-type well, the forming of the p-type well, and the forming of the transistor, is applied at, at least one of, a time between said formation of the semiconductor device and inspection of the circuit characteristics of the semiconductor device, a time when dicing said semiconductor wafer, and a time between dicing said semiconductor wafer and inspecting circuit characteristics of said semiconductor chip.

19. The method according to claim 18,
wherein removal of said heavy metal ions comprises transferring said heavy metal ions from said p-type well to said n-type well by applying said forward bias.

* * * * *